(12) United States Patent
Moriya et al.

(10) Patent No.: US 11,872,669 B2
(45) Date of Patent: Jan. 16, 2024

(54) COVER TO VACUUM DEBRIS WHILE GRINDING

(71) Applicant: DISCO CORPORATION, Tokyo (JP)

(72) Inventors: Toshiyuki Moriya, Tokyo (JP); Tomohiro Shirahama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 331 days.

(21) Appl. No.: 17/452,616

(22) Filed: Oct. 28, 2021

(65) Prior Publication Data

US 2022/0143772 A1 May 12, 2022

(30) Foreign Application Priority Data

Nov. 11, 2020 (JP) .................................. 2020-187880

(51) Int. Cl.
| | |
|---|---|
| *B24B 7/04* | (2006.01) |
| *H01L 21/304* | (2006.01) |
| *B24B 55/04* | (2006.01) |
| *B24B 37/34* | (2012.01) |
| *B24B 55/12* | (2006.01) |

(52) U.S. Cl.
CPC .............. *B24B 7/04* (2013.01); *B24B 37/345* (2013.01); *B24B 55/04* (2013.01); *B24B 55/12* (2013.01); *H01L 21/304* (2013.01)

(58) Field of Classification Search
CPC ... B24B 41/002; B24B 41/04; B24B 41/0475; B24B 41/053; B24B 55/04; B24B 7/228; B24B 37/04; B24B 37/042; B24B 37/07; B24B 37/10; B24B 37/107; B24B 55/06
See application file for complete search history.

(56) References Cited

U.S. PATENT DOCUMENTS

| | | | |
|---|---|---|---|
| 2005/0118938 A1* | 6/2005 | Mizomoto | ............ B24B 37/345 451/65 |
| 2017/0136592 A1 | 5/2017 | Kai | |

FOREIGN PATENT DOCUMENTS

| | | |
|---|---|---|
| JP | 2002059361 A | 2/2002 |
| JP | 2014124690 A | 7/2014 |
| JP | 2019130607 A | 8/2019 |

OTHER PUBLICATIONS

Search report issued in counterpart Singapore patent application No. 10202112199Y, dated Feb. 13, 2023.

* cited by examiner

*Primary Examiner* — Eric J Rosen
*Assistant Examiner* — John C Merino
(74) *Attorney, Agent, or Firm* — Greer Burns & Crain Ltd.

(57) ABSTRACT

A processing machine includes a chuck table, a chuck table cover having an opening through which a holding surface of the chuck table can protrude, a processing unit having a spindle, a spindle housing, and a mount portion arranged on a lower end portion of the spindle, the processing unit being configured to process a workpiece by a processing tool mounted on a lower part of the mount portion, a processing chamber construction cover that covers the chuck table and the mount portion. The processing machine further includes a processing tool cover that is secured to a lower end portion of the spindle housing and that has an upper wall and a side wall that extends downwardly from the upper wall. The processing tool cover is disposed inside the processing chamber construction cover and covers the processing tool from above and sides by the upper and side walls.

3 Claims, 4 Drawing Sheets

COVER TO VACUUM DEBRIS WHILE GRINDING

BACKGROUND OF THE INVENTION

Field of the Invention

The present invention relates to a processing machine which includes a processing unit, the processing unit having a spindle and a disc-shaped mount portion arranged on a lower end portion of the spindle, and the processing unit configured to process a workpiece by a processing tool mounted on a lower part of the mount portion.

Description of the Related Art

In a manufacturing process of semiconductor devices, circuits such as integrated circuits (ICs) or large scale integration (LSI) circuits are first formed on a side of a front surface of, for example, a semiconductor wafer, and the semiconductor wafer is then ground on a side of a back surface thereof by a grinding machine. The semiconductor wafer, which has been thinned through the grinding, is next cut by a cutting machine, whereby the semiconductor wafer is divided into the individual semiconductor devices. In the grinding using the grinding machine, the semiconductor wafer generally held on a holding surface of a chuck table is ground on the side of the back surface thereof by an annular grinding wheel, which has a plurality of grinding stones, while grinding water is supplied to the side of the back surface of the semiconductor wafer (see, for example, JP 2014-124690A).

When grinding is performed, the chuck table and the grinding wheel are covered at side portions and upper portions thereof by a cover member, and are disposed in a predetermined space (processing chamber) defined by the cover member. During the grinding, the grinding is performed while supplying grinding water to the grinding wheel, so that the grinding water with grinding debris contained therein splashes around and sticks on an inner wall of the processing chamber. Such grinding debris may therefore adhere to the hands, clothing, and the like of workers when the cover member is opened upon maintenance such as replacement of the grinding wheel and cleaning of the processing chamber. In addition, such grinding debris may fall on the holding surface of the chuck table during maintenance.

SUMMARY OF THE INVENTION

Assuming that grinding of a new workpiece is performed with grinding debris still remaining stuck on the holding surface, suction holding failure may occur on the holding surface, thereby causing such an inconvenience that the workpiece may be cracked or chipped during the grinding. As appreciated from the foregoing, processing debris such as grinding debris can lead to various problems in a processing machine. With such problems in view, the present invention has as an object thereof the provision of a processing machine which can reduce the amount of processing debris sticking on an inner wall of a processing chamber.

In accordance with an aspect of the present invention, there is provided a processing machine including a chuck table having a holding surface that holds a workpiece thereon, a chuck table cover enclosing surroundings of the chuck table and having an opening through which the holding surface of the chuck table is able to protrude, a processing unit including a spindle, a spindle housing that rotatably holds the spindle therein, and a disc-shaped mount portion arranged on a lower end portion of the spindle, the lower end portion projecting from the spindle housing, the processing unit being configured to process the workpiece by a processing tool mounted on a lower part of the mount portion, a processing feed mechanism that feeds the processing unit in an up-down direction to perform processing, a processing chamber construction cover that covers the chuck table and the mount portion, and a processing tool cover that is secured to a lower end portion of the spindle housing, the lower end portion being located inside the processing chamber construction cover, has an upper wall defining an insertion opening through which the spindle is able to be inserted at the lower end portion thereof, and a side wall that is connected to the upper wall and extends downwardly from the upper wall, is disposed inside the processing chamber construction cover, and covers the processing tool from above and sides by the upper wall and the side wall.

Preferably, the processing tool cover is secured to the lower end portion of the spindle housing in a manner that allows detachment of the processing tool cover from the spindle housing.

Also, preferably, the processing machine further includes an exhaust unit including an exhaust duct that is connected at an end portion thereof to the processing tool cover and at an opposite end portion thereof to a suction source.

The processing machine according to the aspect of the present invention also includes the processing tool cover in addition to the chuck table, the chuck table cover, the processing unit, the processing feed mechanism, and the processing chamber construction cover. The processing tool cover is disposed inside the processing chamber construction cover, and covers the processing tool from above and sides by the upper wall and the side wall. Because the processing tool is covered by the processing tool cover disposed inside the processing chamber construction cover as described above, processing debris and the like are limited in their splash range, and stick primarily on an inner wall of the processing tool cover. It is therefore possible to reduce the amount of processing debris sticking on an inner wall of the processing chamber construction cover.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
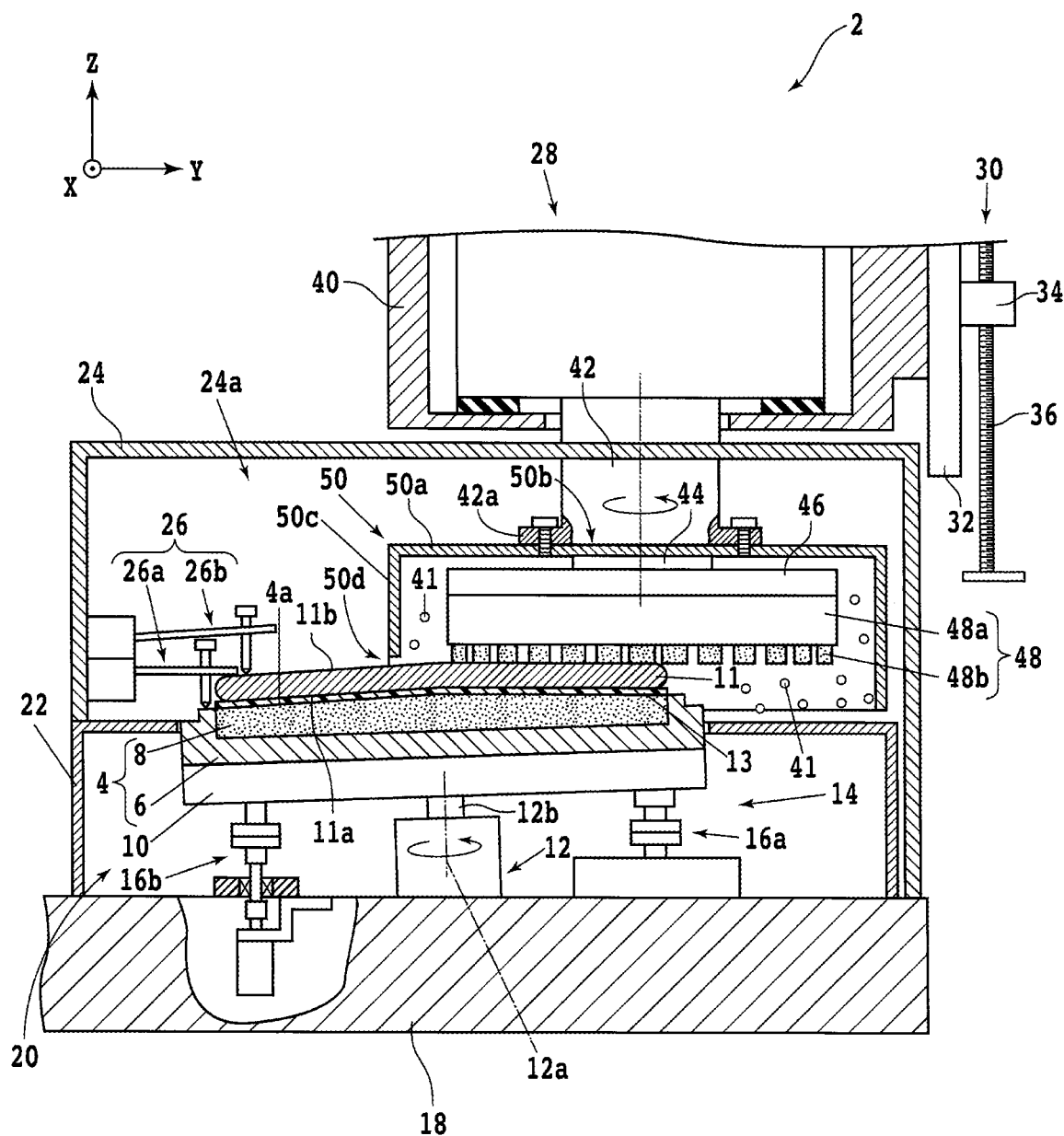
FIG. 1 is a partly sectional side view of a grinding machine as an example of a processing machine according to a first embodiment of an aspect of the present invention.

With reference to the attached drawings, a description will be made about embodiments of an aspect of the present invention. FIG. 1 is a partly sectional side view of a grinding machine 2 as an example of a processing machine according to a first embodiment. It is to be noted that an X-axis direction, a Y-axis direction (front-to-rear direction), and a Z-axis direction (top-down direction, vertical direction, grinding feed direction), all indicated in FIG. 1, are orthogonal to one another. The grinding machine 2 of this embodiment is of a fully automatic type that automatically performs loading, grinding, cleaning, and unloading of a workpiece 11. However, the grinding machine 2 is not limited to the fully automatic type. The grinding machine 2 may be of a manual type that performs only the grinding of the workpiece 11. If this is the case, the loading, unloading, and the like of the workpiece 11 are performed by workers.

The workpiece 11 to be ground by the grinding machine 2 is, for example, a silicon-made, disc-shaped wafer with a plurality of devices (not depicted) formed on a side of a front surface 11a. However, the workpiece 11 may be formed from a compound such as silicon carbide (SiC) or gallium nitride (GaN), or may also be formed from a material other than those mentioned above. With a resin-made protective tape 13 bonded on the side of the front surface 11a, the workpiece 11 is ground on a side of a back surface 11b located on a side opposite to the front surface 11a. When the workpiece 11 is ground, the workpiece 11 is held on the side of the front surface 11a under suction on a holding surface 4a of a chuck table 4.

The chuck table 4 has a disc-shaped frame member 6 formed of ceramics. On a side of an upper surface of the frame member 6, a disc-shaped recess is formed. A disc-shaped porous plate 8 formed of porous ceramics is fixed in the recess. The porous plate 8 has a substantially planar bottom surface, and an upper surface that increases in thickness from an outer periphery toward a center thereof. In other words, the upper surface of the porous plate 8 is a conical surface that slightly bulges upward at a central part compared with a peripheral part thereof.

In a bottom surface of the recess of the frame member 6, a plurality of flow paths (not depicted) is formed radially. In the frame member 6, a central flow channel (not depicted) is also formed such that it centrally extends through a bottom surface of the frame member 6 and is connected to the radial flow paths. A suction source (not depicted) such as a vacuum pump is connected to the central flow channel, and when the suction source is operated, a negative pressure is transmitted to the upper surface of the porous plate 8. The upper surface of the porous plate 8 therefore functions as the holding surface 4a on which the workpiece 11 is held under suction via the protective tape 13.

The chuck table 4 is rotatably connected on a disc-shaped table base 10 via bearings (not depicted). A through-hole (not depicted) is formed in the table base 10, and a rotary drive source 12 such as a motor is disposed underneath the table base 10. The rotary drive source 12 has a rotary shaft 12b connected to a bottom portion of the chuck table 4 through the through-hole of the table base 10. When the rotary drive source 12 is operated, the chuck table 4 is rotated about an axis 12a of rotation.

Underneath the table base 10 and around the rotary drive source 12, a tilt adjustment mechanism 14 is arranged to support the table base 10 and to adjust a tilt of the axis 12a of rotation with respect to the Z-axis direction. The tilt adjustment mechanism 14 has a single fixed leg 16a and two vertically adjustable legs 16b. The fixed leg 16a and the vertically adjustable legs 16b are arranged at substantially equal intervals along a peripheral direction of the table base 10. It is to be noted that, in FIG. 1, only one of the vertically adjustable legs 16b is depicted. The vertically adjustable legs 16b can each independently lift up or down the table base 10 in the Z-axis direction.

A height position at which the table base 10 is to be supported is adjusted by one or both of the vertically adjustable legs 16b, whereby the tilt of the axis 12a of rotation with respect to the Z-axis direction is set. The axis 12a of rotation is adjusted in tilt angle such that an area of the holding surface 4a lies substantially in parallel with an X-Y plane. The tilt adjustment mechanism 14 is supported by a disc-shaped turn table 18. On the turn table 18, a plurality of table units 20 is disposed, each of which includes the above-mentioned chuck table 4, table base 10, rotary drive source 12, and tilt adjustment mechanism 14. For example, three table units 20 are disposed on the turn table 18 such that they are spaced apart at intervals of approximately 120 degrees in the peripheral direction of the turn table 18. By rotation of the turn table 18, each table unit 20 is arranged in one of a loading/unloading region, a coarse grinding region, and a finish grinding region for the workpiece 11.

The table unit 20 depicted in FIG. 1 is arranged in the coarse grinding region. Surroundings of each table unit 20 are covered by a chuck table cover 22 such that the holding surface 4a of the chuck table 4 is exposed. The chuck table cover 22 is formed, for example, of a metal, and has an opening 22a (see FIG. 2) of a diameter slightly greater than an outer diameter of the frame member 6. From the opening 22a, an upper portion of the frame member 6, which includes the holding surface 4a, protrudes.

In the coarse grinding region depicted in FIG. 1 and the finish grinding region, the chuck table cover 22 and the chuck table 4 are covered at upper parts thereof by a processing chamber construction cover 24 formed of a metal or the like. Therefore, the upper part of the chuck table 4 is disposed in a processing chamber 24a. In a vicinity of the upper part of the chuck table 4, a thickness measuring unit (height gauge) 26 is disposed to measure the thickness of the workpiece 11, and the thickness measuring unit 26 is also arranged in the processing chamber 24a. The thickness measuring unit 26 depicted in FIG. 1 is of a contact type, and has a first measuring instrument 26a and a second measuring instrument 26b. The first measuring instrument 26a can be brought into contact with the upper surface of the frame member 6 of the holding surface 4a, and the second measuring instrument 26b is located above an outer peripheral portion of the porous plate 8, and can be brought into contact with the back surface 11b of the workpiece 11 held on the holding surface 4a.

Over a region above the holding surface 4a, the region being different from a region where the thickness measuring unit 26 is arranged, a coarse grinding unit (processing unit) 28 is disposed. The coarse grinding unit 28 is fed along the Z-axis direction by a processing feed mechanism 30 to perform processing. The processing feed mechanism 30 has a pair of guide rails (not depicted) fixed to a bed of the grinding machine 2 in a manner that the guide rails are substantially parallel to each other in the Z-axis direction. To the paired guide rails, a Z-axis moving plate 32 is slidably attached.

On a rear side (back surface) of the Z-axis moving plate 32, nut portions 34 are disposed. A ball screw 36 is disposed along the Z-axis direction between the paired rails, and is connected in a rotatable manner to the nut portions 34. To an upper end portion of the ball screw 36, a drive source (not depicted) such as a pulse motor is connected. When the ball screw 36 is rotated by the pulse motor, the Z-axis moving plate 32 is moved in the Z-axis direction along the guide rails.

On a front side (front surface) of the Z-axis moving plate 32, the above-mentioned coarse grinding unit 28 is fixed. The coarse grinding unit 28 has a cylindrical holding member 40 fixed on the Z-axis moving plate 32. Inside the holding member 40, a cylindrical spindle housing 42 is disposed substantially in parallel with the Z-axis direction. A cylindrical spindle 44 is disposed substantially in parallel with the Z-axis direction, and is rotatably held at a portion thereof in the spindle housing 42.

To an upper end portion of the spindle 44, a rotary drive source (not depicted) such as a servo motor is connected. A lower end portion of the spindle 44 downwardly projects from a lower end of the spindle housing 42, and a disc-shaped mount portion (wheel mount) 46 is fixed on the lower end portion of the spindle 44. The mount portion 46 is located in the processing chamber 24a, and is covered by the processing chamber construction cover 24. On a lower part of the mount portion 46, an annular coarse grinding wheel (processing tool) 48 is mounted by fixing members (not depicted) such as screws.

The coarse grinding wheel 48 has a ring-shaped wheel base 48a formed of a metal material such as an aluminum alloy. The wheel base 48a has a diameter which is substantially the same as that of the mount portion 46, and to a side of a lower surface of the wheel base 48a, a plurality of coarse grinding stones 48b is attached. The coarse grinding stones 48b are arrayed in an annular pattern along a peripheral direction of the lower surface of the wheel base 48a in a manner that clearances are provided between the adjacent coarse grinding stones 48b themselves. The coarse grinding stones 48b are formed, for example, by mixing abrasive grits of diamond, cubic boron nitride (cBN), or the like in a binder material such as a metal, ceramics, or a resin, and then conducting molding, firing, and the like.

On a radially inner side of the wheel base 48a than the coarse grinding stones 48b, a plurality of grinding water supply openings (not depicted) is discretely arranged along the peripheral direction of the lower surface of the wheel base 48a. To supply grinding water 41 such as pure water to the individual grinding water supply openings, a central flow channel (not depicted) is formed through the mount portion 46, the spindle 44, and the like, and is communicated at a downstream end thereof to individual flow paths (not depicted) formed in the wheel base 48a and communicating to the individual grinding water supply openings. To an upstream end of the central flow channel, a grinding water supply unit (not depicted) is connected. During the grinding, the grinding water 41 is supplied from the grinding water supply unit to the coarse grinding stones 48b. When the workpiece 11 is ground (processed) by the coarse grinding wheel 48, the grinding water 41 with grinding debris (processing debris) contained therein therefore splashes around. In this embodiment, a cylindrical processing tool cover 50 is disposed inside the processing chamber construction cover 24 to limit a range to which the grinding water 41 with the grinding debris contained therein splashes.

Figure 2:
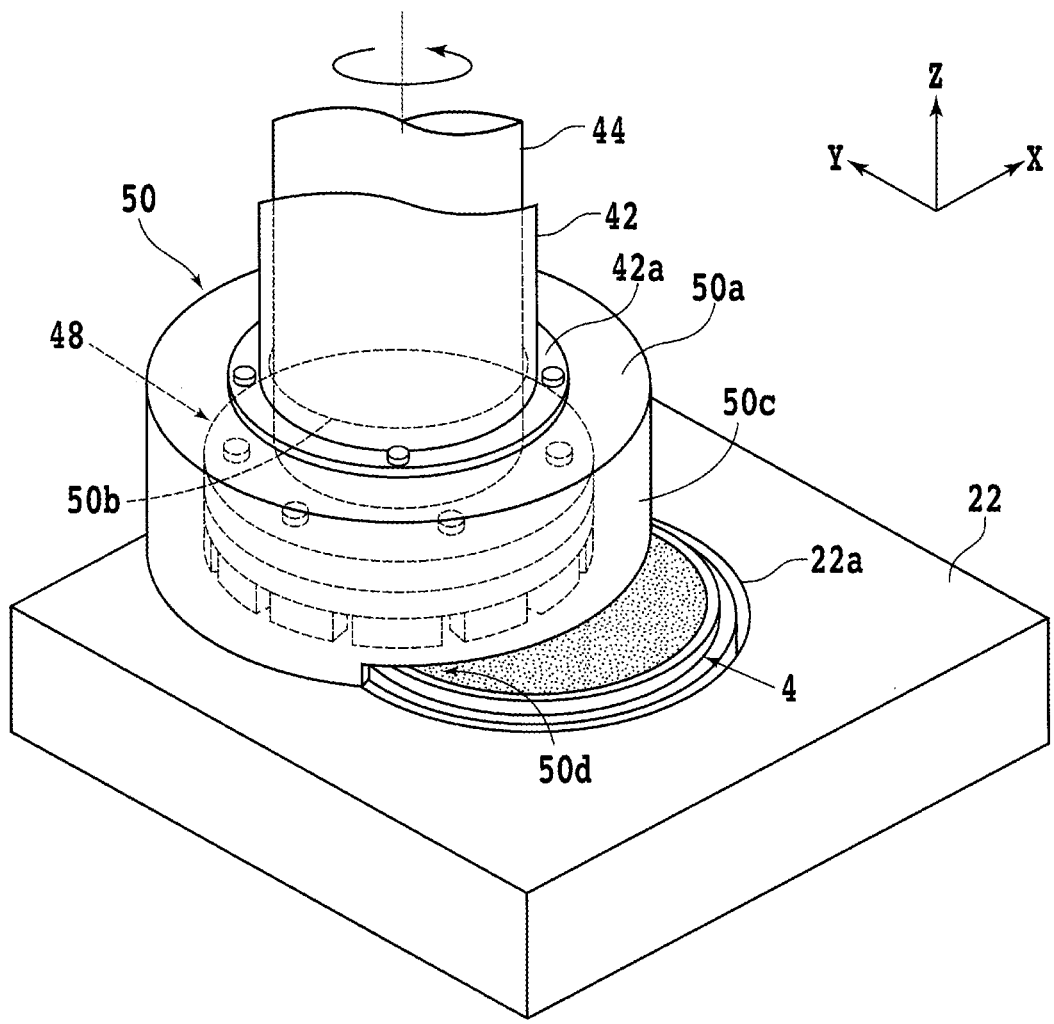
FIG. 2 is a perspective view of a processing tool cover and its associated elements in the grinding machine of FIG. 1.

FIG. 2 is a perspective view of the processing tool cover 50 and its associated elements. It is to be noted that, in FIG. 2, the workpiece 11, the processing chamber construction cover 24, the thickness measuring unit 26, and the like are omitted. The processing tool cover 50 is formed of a material transparent to visible light, such as acrylic resin. The processing tool cover 50 has a circular upper wall 50a, and the upper wall 50a has a diameter which is, for example, greater by 1 cm to 2 cm, approximately, than that of the coarse grinding wheel 48.

The upper wall 50a is secured via fixing members such as screws to a flange portion 42a located at a lower end portion of the spindle housing 42. The upper wall 50a has an insertion opening 50b through which the lower end portion of the spindle 44 can be inserted. To an outer peripheral portion of the upper wall 50a, a side wall 50c is connected in a manner that it extends downwards from the upper wall 50a. As depicted in FIGS. 1 and 2, the upper wall 50a and the side wall 50c cover the coarse grinding wheel 48 from above and sides.

The side wall 50c has a substantially uniform height, and a cut-out portion 50d is formed at a part of a lower end portion of the side wall 50c. The cut-out portion 50d is formed in a range that transversely crosses the opening 22a of the chuck table cover 22. The height position of an upper edge of the cut-out portion 50d is located slightly higher than the height position of a grinding surface of the coarse grinding wheel 48 (in other words, lower surfaces of the coarse grinding stones 48b). When grinding the workpiece 11 by the grinding surface, the height position of the upper edge of the cut-out portion 50d is located, for example, approximately 5 mm above the back surface 11b of the workpiece 11 held under suction on the holding surface 4a. On the other hand, the height position of a lower end of the side wall 50c in a range where the cut-out portion 50d is not formed is located lower than the holding surface 4a. The formation of the cut-out portion 50d in the lower end portion of the side wall 50c as described above enables to avoid an interference between the side wall 50c and the workpiece 11 when the workpiece 11 which is held on the holding surface 4a is transferred to the coarse grinding region, and also to cover the workpiece 11 when it is ground (processed) by the coarse grinding unit 28.

The processing tool cover 50 is secured in such a manner as to be detachable to the flange portion 42a. The processing tool cover 50 can be disassembled, for example, such that the upper wall 50a is divided into equal halves. Accordingly, the processing tool cover 50 can be disassembled and detached from the flange portion 42a if the fixing members that fix the flange portion 42a and the processing tool cover 50 together are removed.

A region right underneath the coarse grinding wheel 48 corresponds to the above-mentioned coarse grinding region. When being ground by the coarse grinding unit 28, the workpiece 11 is first held on the side of the front surface 11a thereof under suction on the chuck table 4 arranged in the coarse grinding region. In this state, the coarse grinding unit 28 is downwardly fed by the processing feed mechanism 30 to perform grinding while supplying the grinding water 41 to the coarse grinding stones 48b and at the same time rotating the chuck table 4 and the coarse grinding wheel 48 in predetermined directions, respectively. When the coarse grinding stones 48b come into contact with the side of the back surface 11b of the workpiece 11, the workpiece 11 is ground at an area of contact on the side of the back surface 11b.

In this embodiment, the coarse grinding wheel 48 is covered by the processing tool cover 50 separately and independently disposed inside the processing chamber construction cover 24. Compared with a case in which the processing tool cover 50 is not disposed, the grinding water 41 or the like, which contains grinding debris, is hence more limited in its splash range, and sticks primarily on an inner wall of the processing tool cover 50. It is therefore possible to reduce the amount of processing debris sticking on the inner wall of the processing chamber construction cover 24. Further, grinding debris falls on the holding surface 4a when the processing chamber construction cover 24 is opened upon maintenance of the processing chamber 24a. The amount of such falling cutting debris can also be sufficiently reduced compared with the case in which the processing tool cover 50 is not disposed.

If the processing tool cover 50 is not disposed, the grinding water 41 with grinding debris contained therein also sticks on, in addition to the inner wall of the processing chamber construction cover 24, an instrument, such as the thickness measuring unit 26, arranged in the processing chamber 24a. If grinding debris sticks on the instrument in the processing chamber 24a, problems may arise on the operation of the instrument. Assuming, for example, that grinding debris sticks on the thickness measuring unit 26, the thickness of the workpiece 11 can no longer be measured accurately by the thickness measuring unit 26. In this embodiment, however, the processing tool cover 50 can reduce the amount of grinding debris sticking on the instrument in the processing chamber 24a, and therefore can reduce the possibility of problems that may arise on the operation of the instrument. It is to be noted that a similar processing chamber construction cover 24 and processing tool cover 50 may also be disposed in the above-mentioned finish grinding region. Further, a similar processing chamber construction cover 24 and processing tool cover 50 may also be disposed in the grinding machine 2 of the manual type.

Figure 3:
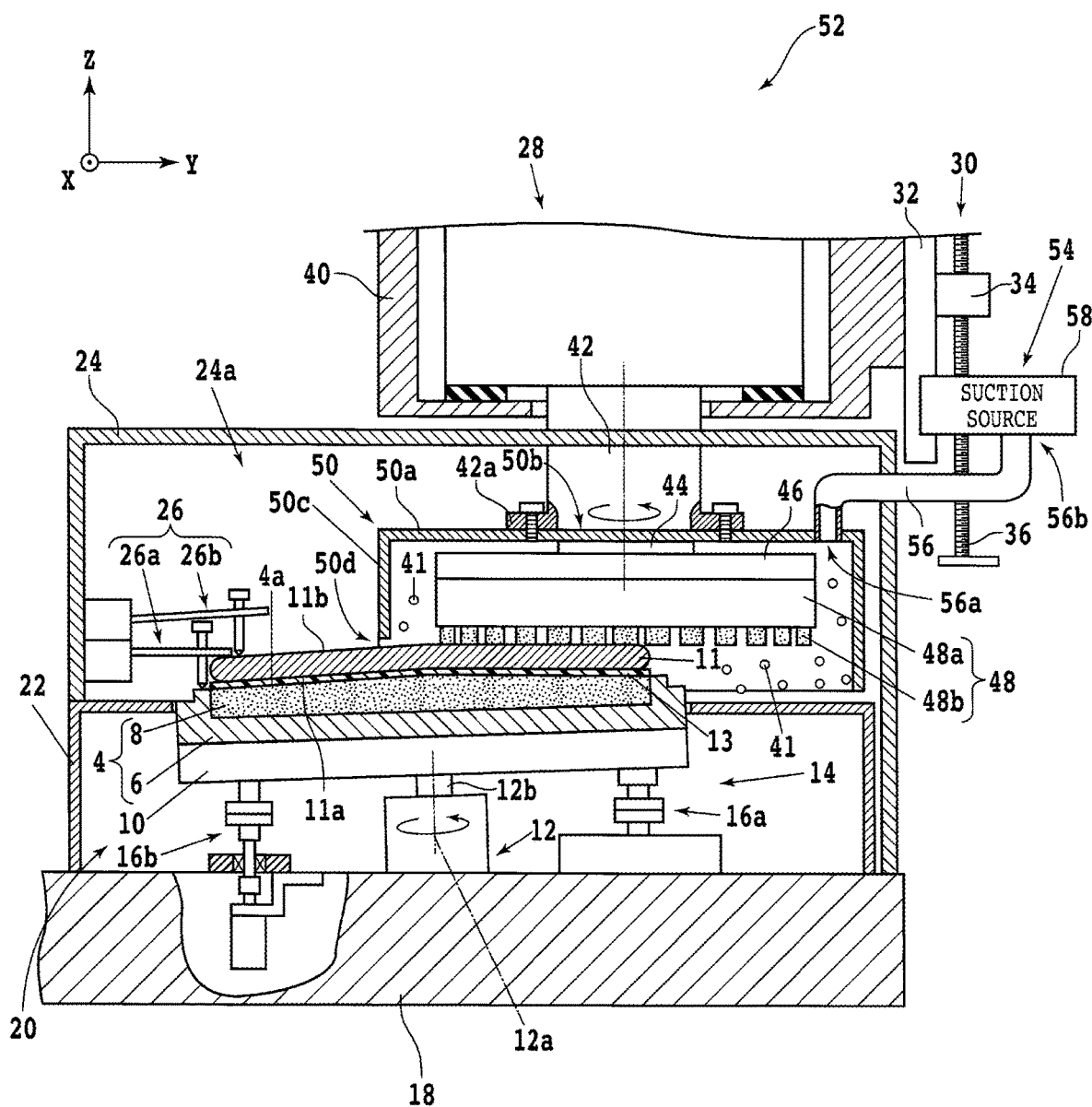
FIG. 3 is a partly sectional side view of a grinding machine as an example of a processing machine according to a second embodiment of the aspect of the present invention.

A description will next be made about a second embodiment. FIG. 3 is a partly sectional side view of a grinding machine 52 as an example of a processing machine according to the second embodiment of the aspect of the present invention. The grinding machine 52 further includes an exhaust unit 54 that can suck the inside of the processing tool cover 50. The exhaust unit 54 includes an exhaust duct 56 having flexibility. The exhaust duct 56 is connected at an end portion 56a thereof to the inside of the processing tool cover 50, and at an opposite end portion 56b thereof to a suction source 58 such as an ejector. As the suction source 58, a suction source, which is generally used when sucking grinding debris in the processing chamber 24a, may also be used in common. In the second embodiment, the inside of the processing tool cover 50, the inside being a space smaller than the processing chamber 24a, is sucked by the suction source 58, so that the grinding water 41 with grinding debris contained therein can be sufficiently sucked even if the existing suction source for sucking the processing chamber 24a is also used as the suction source 58 in common.

Figure 4:
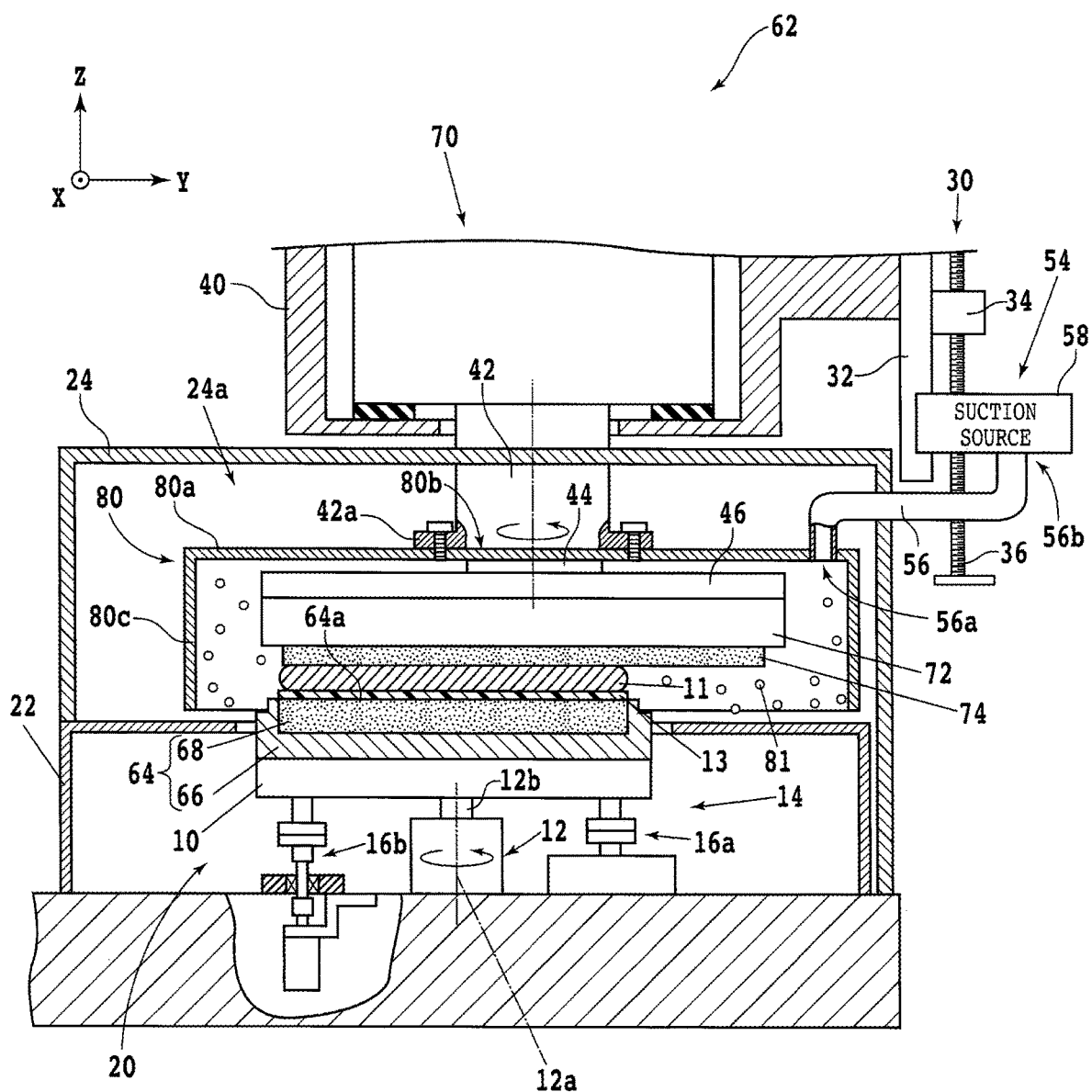
FIG. 4 is a partly sectional side view of a polishing machine as an example of a processing machine according to a third embodiment of the aspect of the present invention.

A description will next be made about a third embodiment. FIG. 4 is a partly sectional side view of a polishing machine 62 as an example of a processing machine according to the third embodiment of the aspect of the present invention. The polishing machine 62 is a wet polishing machine of what is generally called a manual type, and has a chuck table 64 of a small diameter compared with the chuck table 4. Similar to the chuck table 4, the chuck table 64 has a frame member 66 and a porous plate 68. However, the upper surface of the porous plate 68 is not a conical surface but is a substantially planar surface. The upper surface of the frame member 66 and the upper surface of the porous plate 68 are substantially flush with each other and make up as a holding surface 64a.

Above the chuck table 64, a polishing unit (processing unit) 70 is disposed. Similar to the coarse grinding unit 28, the polishing unit 70 has a holding member 40, a spindle housing 42, a spindle 44, a mount portion 46, and the like.

The holding member 40 of the polishing unit 70 is connected to a processing feed mechanism 30. However, a disc-shaped base 72 is mounted on a side of a lower surface of the mount portion 46. On a side of a lower side of the base 72, on the other hand, a disc-shaped polishing pad 74 is fixed. The polishing pad 74 has a through hole (not depicted) at a center portion in a diametrical direction of the polishing pad 74. The base 72 and the polishing pad 74 make up a processing tool.

To supply polishing fluid 81, a central flow channel (not depicted) is formed through the spindle 44, the mount portion 46, the base 72, and the like, and a polishing fluid supply unit (not depicted) is connected to an upstream end of the central flow channel. The central flow channel is communicated at a downstream end thereof to the through hole of the polishing pad 74. During the polishing, the polishing fluid 81 is supplied from the polishing fluid supply unit to the polishing pad 74 and the workpiece 11 through the central flow channel and the through hole. During the polishing (processing), the polishing fluid 81 with polishing debris (processing debris) contained therein therefore splashes around.

To a flange portion 42a of the spindle housing 42, a processing tool cover 80 is secured. The processing tool cover 80 has a disc-shaped upper wall 80a. In the upper wall 80a, an insertion opening 80b is formed for the insertion of the spindle 44. To an outer peripheral portion of the upper wall 80a, a side wall 80c is connected such that it extends downwards from the upper wall 80a. The processing tool cover 80 covers the base 72 and the polishing pad 74 (processing tool) from above and sides by the upper wall 80a and the side wall 80c.

In particular, the processing tool cover 80 in the third embodiment does not have the cut-out portion 50d, and also covers the workpiece 11 from sides in addition to the base 72 and the polishing pad 74. During the polishing, however, a slight clearance (of, for example, a few or several millimeters) is formed between a lower end of the processing tool cover 80 and an upper surface of a chuck table cover 22. Similar to the processing tool cover 50, the processing tool cover 80 is also secured in such a manner as to be detachable to the flange portion 42a. The processing tool cover 80 can be disassembled, for example, such that the upper wall 80a is divided into equal halves.

If the polishing fluid 81 with polishing debris contained therein splashes in the third embodiment, its splash range is limited within the processing tool cover 80. It is therefore possible to sufficiently reduce the amount of polishing debris sticking on an inner wall of a processing chamber construction cover 24. In addition, polishing debris does not fall on the holding surface 64a when the processing chamber construction cover 24 is opened upon maintenance of a processing chamber 24a. Further, the inside of the processing tool cover 80, the inside being a space smaller than the processing chamber 24a, is sucked by a suction source 58, so that the polishing fluid 81 with polishing debris contained therein can be sufficiently sucked even if the existing suction source for sucking the processing chamber 24a is also used as the suction source 58 in common.

Moreover, the configurations, operation, and the like of the above-described embodiments can be practiced with changes or alterations as needed to such extent as not departing from the scope of the object of the present invention. For example, the polishing machine 62 can also be disposed in a polishing region of a processing machine of the fully automatic type that performs coarse grinding, finish grinding, and polishing. In the case of the fully automatic type, however, the upper surface of the porous plate 68 is formed into a conical surface that slightly bulges upward at a central part compared with a peripheral part thereof. Further, the axis 12*a* of rotation is adjusted in tilt angle such that an area of the holding surface 64*a* lies substantially in parallel with the X-Y plane. Furthermore, during the polishing, the polishing pad 74 comes into contact with a portion of the workpiece 11 held on the holding surface 64*a*.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing machine comprising:
   a chuck table having a holding surface that holds a workpiece thereon;
   a chuck table cover enclosing surroundings of the chuck table and having an opening through which the holding surface of the chuck table is able to protrude;
   a processing unit including a spindle, a spindle housing that rotatably holds the spindle therein, and a disc-shaped mount portion arranged on a lower end portion of the spindle, the lower end portion projecting from the spindle housing, the processing unit being configured to process the workpiece by a processing tool mounted on a lower part of the mount portion;
   a processing feed mechanism that feeds the processing unit in an up-down direction to perform processing;
   a processing chamber construction cover that covers the chuck table and the mount portion; and
   a processing tool cover that is secured to a lower end portion of the spindle housing, the lower end portion being located inside the processing chamber construction cover, has an upper wall defining an insertion opening through which the spindle is able to be inserted at the lower end portion thereof, and a side wall that is connected to the upper wall and extends downwardly from the upper wall, is disposed inside the processing chamber construction cover, and covers the processing tool from above and sides by the upper wall and the side wall.

2. The processing machine according to claim 1, wherein the processing tool cover is secured to the lower end portion of the spindle housing in a manner that allows detachment of the processing tool cover from the spindle housing.

3. The processing machine according to claim 1, further comprising:
   an exhaust unit including an exhaust duct that is connected at an end portion thereof to the processing tool cover and at an opposite end portion thereof to a suction source.

* * * * *